United States Patent
Guo et al.

(10) Patent No.: US 9,704,581 B2
(45) Date of Patent: Jul. 11, 2017

(54) VOLTAGE RAMPING DETECTION

(71) Applicant: Intel Corporation, Santa Clara, CA (US)

(72) Inventors: Jason Guo, San Jose, CA (US); Qiang Tang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/583,624

(22) Filed: Dec. 27, 2014

(65) Prior Publication Data

US 2016/0189779 A1    Jun. 30, 2016

(51) Int. Cl.
| | |
|---|---|
| *G11C 7/10* | (2006.01) |
| *G11C 16/30* | (2006.01) |
| *G11C 16/04* | (2006.01) |
| *G11C 16/06* | (2006.01) |
| *G11C 5/14* | (2006.01) |

(52) U.S. Cl.
CPC .............. *G11C 16/06* (2013.01); *G11C 5/143* (2013.01); *G11C 5/145* (2013.01); *G11C 7/1063* (2013.01); *G11C 16/30* (2013.01); *G11C 16/0483* (2013.01)

(58) Field of Classification Search
CPC ........................... G11C 11/4074; G11C 16/30
USPC ..... 365/226, 189.09, 185.18, 185.19, 185.25
See application file for complete search history.

(56) References Cited

U.S. PATENT DOCUMENTS

| | | | | |
|---|---|---|---|---|
| 5,243,228 | A * | 9/1993 | Maruyama | G05F 3/205 327/261 |
| 5,594,360 | A * | 1/1997 | Wojciechowski | G01R 19/16576 365/226 |
| 5,663,918 | A * | 9/1997 | Javanifard | G11C 16/30 365/185.33 |
| 5,671,179 | A * | 9/1997 | Javanifard | G11C 16/30 365/185.33 |
| 5,696,730 | A * | 12/1997 | Slezak | G11C 8/18 365/189.07 |
| 5,880,622 | A * | 3/1999 | Evertt | G11C 16/30 327/535 |
| 6,034,895 | A * | 3/2000 | Naura | G11C 16/12 365/185.18 |
| 6,288,951 | B1 * | 9/2001 | Chen | G11C 5/145 365/189.09 |
| 6,404,221 | B1 * | 6/2002 | Kawakubo | G01R 19/16552 324/76.11 |

(Continued)

OTHER PUBLICATIONS

International Search Report and Written Opinion for PCT Patent Application No. PCT/US2015/062834, Mailed Mar. 8, 2016, 12 pages.

(Continued)

*Primary Examiner* — Hoai V Ho
*Assistant Examiner* — Roberto Mancera
(74) *Attorney, Agent, or Firm* — Compass IP Law PC

(57) ABSTRACT

Method, system and apparatus for detecting voltage ramping to a target voltage level in steady state, comprising, ramping a regulated voltage to a steady state target voltage for an operation of a load circuit, the steady state target voltage being a voltage level that enables the load circuit to perform the operation, generating an output signal indicating that the regulated voltage has reached the target voltage and generating a ready signal responsive to detecting the output signal.

16 Claims, 8 Drawing Sheets

(56) References Cited

U.S. PATENT DOCUMENTS

| | | | | |
|---|---|---|---|---|
| 6,424,578 B2* | 7/2002 | Sim | H02M 3/07 | 363/59 |
| 6,452,766 B1* | 9/2002 | Carper | G05F 1/573 | 323/277 |
| 6,861,895 B1* | 3/2005 | Liu | H02M 3/073 | 257/E27.047 |
| 6,922,360 B2* | 7/2005 | Ryoo | H03K 17/164 | 365/185.18 |
| 7,092,308 B2* | 8/2006 | Choi | G11C 16/30 | 365/149 |
| 7,157,892 B1* | 1/2007 | Ritter | G05F 1/468 | 323/284 |
| 7,366,048 B2* | 4/2008 | Byeon | G11C 5/147 | 365/189.09 |
| 7,376,023 B2* | 5/2008 | Umezawa | G11C 5/145 | 365/189.07 |
| 7,650,550 B2* | 1/2010 | Ramaswami | G01R 31/31707 | 714/724 |
| 7,791,320 B2* | 9/2010 | Park | G11C 16/30 | 323/268 |
| 7,835,198 B2* | 11/2010 | Choi | G11C 5/14 | 365/149 |
| 7,847,581 B2* | 12/2010 | Lisart | H01L 23/576 | 326/101 |
| 8,129,969 B1* | 3/2012 | Chui | H02M 3/157 | 323/283 |
| 8,278,996 B2* | 10/2012 | Miki | G11C 5/147 | 327/103 |
| 8,432,228 B1* | 4/2013 | Dolin | H03F 1/0266 | 330/285 |
| 8,493,795 B2* | 7/2013 | Kuriyama | G05F 1/563 | 365/185.23 |
| 8,669,801 B2* | 3/2014 | Ochoa | H03H 19/004 | 327/278 |
| 8,681,567 B2* | 3/2014 | Missiroli | G11C 16/06 | 365/185.24 |
| 8,841,890 B2* | 9/2014 | Ochoa | G06K 19/0715 | 323/226 |
| 9,057,761 B2* | 6/2015 | Whatmough | G01R 31/3004 | |
| 9,189,174 B2* | 11/2015 | Lee | G11C 5/145 | |
| 9,397,653 B2* | 7/2016 | Suzuki | H03K 17/223 | |
| 2001/0012219 A1* | 8/2001 | Lee | G11C 16/30 | 365/189.09 |
| 2003/0204341 A1 | 10/2003 | Guliani et al. | | |
| 2004/0233722 A1* | 11/2004 | Martines | G11C 16/3404 | 365/185.18 |
| 2006/0133149 A1* | 6/2006 | Chae | G11C 5/145 | 365/185.18 |
| 2006/0190746 A1* | 8/2006 | Boerstler | G06F 1/26 | 713/300 |
| 2006/0273847 A1* | 12/2006 | Bracmard | G01R 31/31703 | 327/540 |
| 2007/0018623 A1* | 1/2007 | Lopata | G05F 1/575 | 323/282 |
| 2007/0040599 A1 | 2/2007 | Sato | | |
| 2008/0089142 A1* | 4/2008 | Lee | G11C 16/12 | 365/189.09 |
| 2008/0136396 A1* | 6/2008 | Heilmann | G05F 1/56 | 323/298 |
| 2008/0316666 A1* | 12/2008 | Tamagawa | F02D 41/20 | 361/92 |
| 2009/0096506 A1* | 4/2009 | Ogiwara | G11C 5/147 | 327/530 |
| 2009/0189584 A1* | 7/2009 | Suzuki | G05F 1/573 | 323/284 |
| 2009/0244978 A1* | 10/2009 | Yoshihara | G11C 7/065 | 365/185.21 |
| 2009/0251178 A1* | 10/2009 | Choi | H03K 4/50 | 327/131 |
| 2010/0110793 A1 | 5/2010 | Kim et al. | | |
| 2011/0116320 A1* | 5/2011 | Zhang | G11C 11/5642 | 365/185.21 |
| 2011/0157995 A1 | 6/2011 | Bicksler | | |
| 2011/0235457 A1* | 9/2011 | Hirata | G11C 5/145 | 365/226 |
| 2011/0273156 A1* | 11/2011 | Miyamae | H02M 3/156 | 323/288 |
| 2012/0033501 A1 | 2/2012 | Park et al. | | |
| 2012/0113737 A1* | 5/2012 | Lee | G11C 5/147 | 365/226 |
| 2013/0015837 A1* | 1/2013 | Jenkins | G01R 31/31708 | 324/76.11 |
| 2013/0114338 A1* | 5/2013 | Park | G11C 16/04 | 365/185.03 |
| 2013/0278284 A1* | 10/2013 | Watanabe | H01L 23/576 | 326/8 |
| 2015/0070098 A1* | 3/2015 | Ngo | H03F 3/21 | 330/297 |
| 2015/0100815 A1* | 4/2015 | Xanthopoulos | G11C 7/222 | 713/503 |
| 2015/0168971 A1* | 6/2015 | Tomioka | G05F 1/562 | 323/275 |
| 2015/0213844 A1* | 7/2015 | Nguyen | G11C 5/145 | 365/226 |
| 2015/0309518 A1* | 10/2015 | Nagda | G05F 1/468 | 323/274 |
| 2015/0370314 A1* | 12/2015 | Atkinson | G05F 5/00 | 713/320 |

OTHER PUBLICATIONS

English Translation of Search Report of R.O.C. Patent Application No. 104139405 received Nov. 14, 2016, 1 page.

\* cited by examiner

VOLTAGE RAMPING DETECTION

TECHNICAL FIELD

Examples described herein generally relate to methods, systems, and devices to detect voltage ramping.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2014, Intel Corporation, All Rights Reserved.

BACKGROUND

Digital electronic devices typically include volatile and/or non-volatile electronic memory for program and data storage. There is a wide variety of electronic memory including Random Access Memory (RAM), Read-Only Memory (ROM), and/or Flash memory. Competition in the market for digital electronic devices demands ever increasing speed and decreasing power consumption. Read and write times in electronic memory are important performance parameters having a significant impact on electronic device speeds.

There are many sources of operational delay in NAND memory devices such as wait times between operations. For example, NAND memory device operations involve frequent ramping up and/or ramping down of internal nodes such as wordlines and bitlines. Voltage regulators pull up and/or down such internal nodes. Conventionally, an on-chip controller needs to wait until the ramping is complete for one event before beginning the next event. Further, capacitive loadings of such internal nodes depend on device operation modes. Ramping delays also depend on process variations, supply voltages and temperature conditions. Moreover, 3D (three dimensional) NAND memory devices have even larger capacitive loadings on wordlines and other internal nodes. On-chip charge pumps take time to increase tower voltages to the required higher voltages. To perform operations, internal nodes need significant time to reach "flat-top" voltage, and the amount of time needed can vary significantly for different operation modes and operating conditions. Controllers traditionally manage wait times with trimmable delays. Conventionally, delay trims settings are computed based on testing simulation and device characterization results, and account for worst case conditions. Thus, under nominal or fast conditions, even when internal voltage ramping is completed a controller will wait for the delay determined by trim settings based on a worst case condition. Thus, trimmable delay settings can negatively impact performance times under nominal or better than worst case conditions by increasing average NAND tR (read time) and tProg (write time) parameters.

BRIEF DESCRIPTION OF THE DRAWINGS

The various advantages of the embodiments will become apparent to one skilled in the art by reading the following specification and appended claims, and by referencing the following drawings, in which:

Descriptions of certain details and implementations follow, including a description of the figures, which may depict some or all of the embodiments described below, as well as discussing other potential embodiments or implementations of the inventive concepts presented herein.

DETAILED DESCRIPTION

In an embodiment, an analog detection circuit can be implemented in a NAND memory device to accurately detect the completion of voltage ramping for various operations. Detection of the completion of voltage ramping is referred to as "flat-top" detection. Under most operating conditions, a ramping detection circuit can reduce operating delays, for example delays traditionally associated with trimmable delay settings. With flat-top detection, under any condition other than worst case conditions, voltage ramping detection generates an output signal upon completion of voltage ramping. The voltage ramping detection sends the output signal to a NAND controller to indicate to the controller that the voltage ramping is completed, and the controller can execute the operation. After receiving the indication from the ramping detection, the controller can prompt amore to a subsequent memory access operation or event without having to wait out worst case condition delay times.

Figure 1:
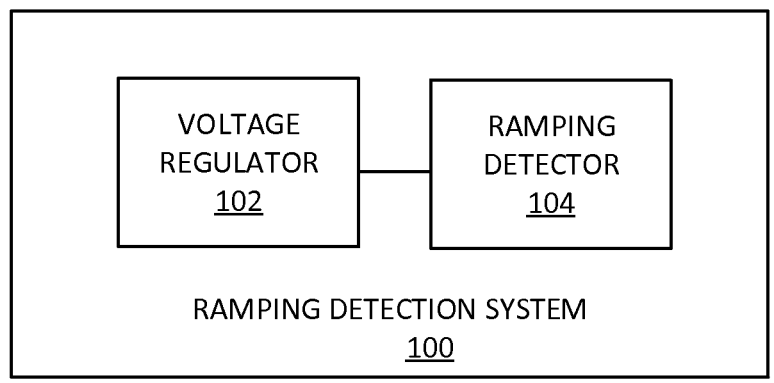
FIG. 1 is a block diagram illustrating an example of a system that detects a ramping voltage flat-top.

FIG. 1 is a block diagram illustrating an example of a system that detects a ramping voltage flat-top. "Ramping" herein refers to consecutive incremental increases in voltage to a target voltage level. A ramping voltage flat-top is a point at which a regulated voltage reaches a target voltage level in steady state. "Steady state" voltage herein refers to a voltage level that enables aloud circuit to perform an operation. When the regulated voltage reaches a steady state target voltage level, voltage ramping is substantially complete within an accepted tolerance range for the target voltage level. Accepted tolerance allows for incidental fluctuations of the regulated voltage, as is understood in the art. Typically, determining that a voltage is in a steady state can require a period of time to determine that the voltage level is being held substantially constant. As described herein, a detection circuit is considered to detect a flat top as soon as the target voltage is initially reached, without having to wait to determine that it is in steady state. Reference to steady state indicates that the detected flat top voltage is the voltage that the regulator will output in steady state operation.

In an embodiment, ramping detection system 100 includes a voltage regulator 102 coupled to a voltage ramping detector 104. Voltage regulator 102 receives a supply voltage and outputs a regulated voltage. Voltage regulator 102 regulates the supply voltage to a target voltage in steady state and detects when the regulated voltage has reached the target voltage level in steady state. Voltage regulator 102 generates an output signal indicating that the regulated voltage has reached the steady state target voltage level.

In an embodiment, voltage regulator provides the output signal to ramping detector 104. Ramping detector 104 is configured to generate a ready signal based on the output signal. The ready signal indicates that voltage ramping is complete. Ramping detector 104 sends the ready signal to a controller to be processed. Voltage ramping is complete if the regulated voltage reaches a threshold value, wherein the threshold value is proportional to a voltage reference signal. Ramping detector 104 can include a common source amplifier. In one embodiment, the output signal is obtained from an existing comparator in voltage regulator 102. Thus, the total additional circuitry is minimal and should not have a significant impact on layout size. In an embodiment, using analog detection circuitry to detect the completion of internal voltage ramping can shorten delays under most operating conditions by reducing the time it takes to perform various operations such as reading and/or programming.

Figure 2A:
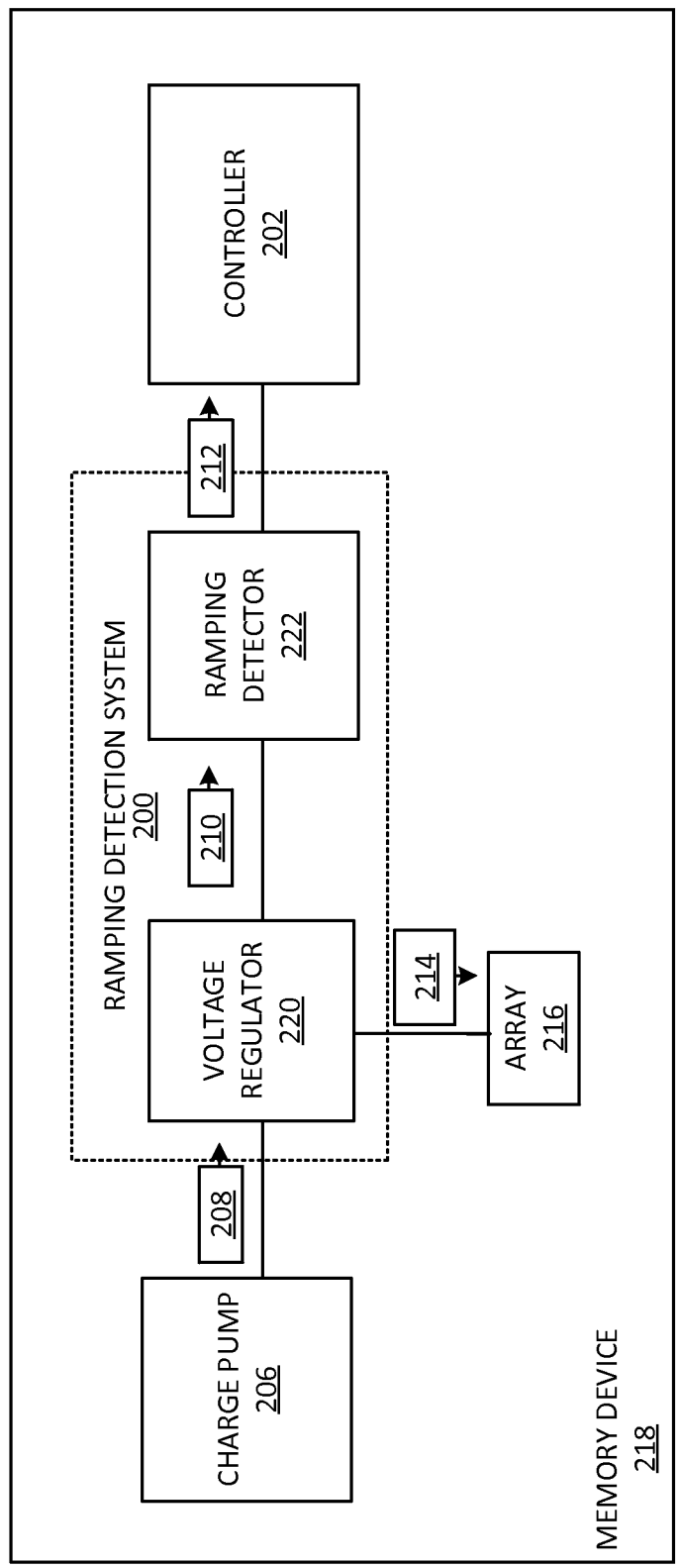
FIG. 2A is a block diagram illustrating a memory device including a ramping detection system.

FIG. 2A is a block diagram illustrating an embodiment of a memory device including a ramping detection system. In an embodiment, memory device 218 includes a ramping detection system 200, a controller 202 and a charge pump 206. Memory device 218 represents any type of memory technology that includes NAND flash memory, NOR flash memory, phase-change memory, resistive memory, magnetoresistive memory, ferroelectric memory, or other memory technology, and/or a combination thereof. Ramping detection system 200 is in accordance with ramping detection system 100. Thus, elements of ramping detection system 200 can have similar features to elements of ramping detection system 100.

Controller 202 controls operations to be performed by memory device 218 in response to memory access commands from an associated memory controller (not specifically shown) such as read, write and/or erase operations for associated memory access commands. Controller 202 is disposed on memory device 218. Controller 202 controls timing and scheduling associated with operating the I/O (input/output) between memory device 218 and the associated memory controller, and the timing and scheduling associated with accessing the storage media (e.g., array 216).

In an embodiment, charge pump 206 provides a supply voltage 208 to voltage regulator 220. Voltage regulator 220 ramps a regulated voltage 214 to a steady state target voltage for an operation of a load circuit in array 216, the steady state target voltage being a voltage level that enables the load circuit to perform the operation. Voltages supplied by charge pump 206 are typically on the order of 5.0 to 20.0 V. However, different voltages can be supplied by charge pump 206 and claimed subject matter is not limited to the example. Voltage regulator 220 down regulates such voltages to generate regulated voltage 214 at the target voltage level. For example, voltage regulator 220 can regulate supply voltage 208 to generate a 10 V regulated voltage 214 to perform a write operation. It will be understood that voltage regulator 220 can generate different voltages for a variety of operations and claimed subject matter is not limited to the example.

In an embodiment, voltage regulator 220 detects or monitors regulated voltage 214. When the target voltage is reached, voltage regulator 220 generates an internal signal based on internal feedback indicating that regulated voltage 214 has reached the target voltage level. The internal signal indicates that regulated voltage 214 is at the steady state target voltage level. In an embodiment, the internal signal can persist as long as regulated voltage 214 remains at the target voltage level within accepted tolerances and variations, as will be understood in the art. Voltage regulator 220 generates an output signal 210 based on the internal signal. Output signal 210 indicates that ramping of regulated voltage 214 is substantially complete within an accepted tolerance range, in accordance with what is previously described. Voltage regulator 220 forwards output signal 210 to ramping detector 222. In an embodiment, ramping detector 222 generates a ready signal 212 based on detecting output signal 210. Ramping detector 222 forwards ready signal 212 to controller 202.

In an embodiment, controller 202 checks and/or processes ready signal 212. When ready signal 212 goes high, controller 202 infers that the internal voltage ramping is substantially complete within an accepted tolerance range. Controller 202 responds to ready signal 212 in a variety of ways. For example, a controller 202 can trigger the load circuit to perform the operation based on ready signal 212. Controller 202 can also move to a next operation and/or command based on detecting ready signal 212. In an embodiment, a load circuit includes a wordline or a bitline. In an embodiment, addition of ramping detection system 200 to memory device 218 can use circuitry already available in memory device 218 with minimal additional circuit add-ons.

Figure 2B:
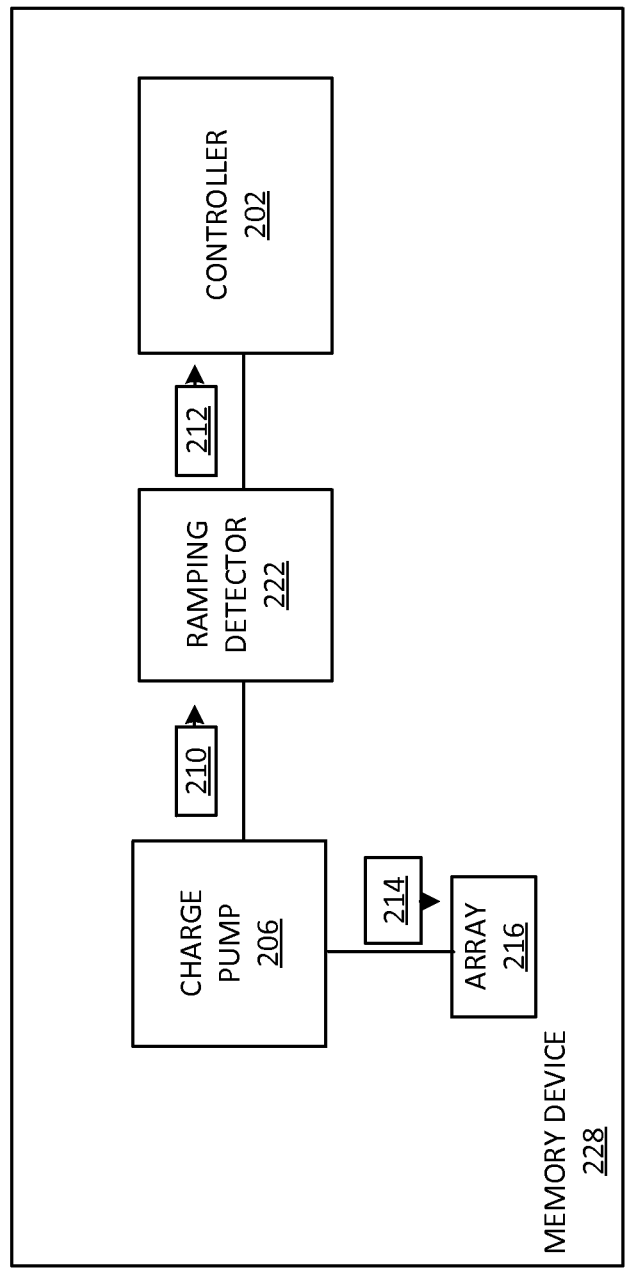
FIG. 2B is a block diagram illustrating a memory device including a ramping detector.

FIG. 2B is a block diagram illustrating an embodiment of a memory device including a ramping detector. In an embodiment, memory device 228 includes a ramping detector 222, a controller 202 and a charge pump 206. It will be observed that memory device 228 includes ramping detector 222 directly coupled to charge pump 206, without being regulated down by a voltage regulator as in memory device 218 of FIG. 2A. It will be understood that such an implementation may require changes to charge pump 206 and/or ramping detector 222 of memory device 228 relative to memory device 218. Charge pump 206 ramps a regulated voltage 214 to a steady state target voltage for an operation of a load circuit in array 216. When the target voltage is reached, charge pump 206 generates an internal signal based on internal feedback indicating that regulated voltage 214 has reached the target voltage level. The internal signal indicates that regulated voltage 214 is at the target voltage level and is in a steady state. In one embodiment, charge pump 206 generates an output signal 210 based on the internal signal. Output signal 210 indicates that ramping of regulated voltage 214 is substantially complete within an accepted tolerance range, as will be understood in the art. Charge pump 206 forwards output signal 210 to ramping detector 222. In an embodiment, ramping detector 222 generates a ready signal 212 based on detecting output signal 210. Ramping detector 222 generates ready signal 212, which it then sends to controller 202. When ready signal 212 goes high, controller 202 infers that the internal voltage ramping is substantially complete and can trigger the load circuit to perform the operation based on ready signal 212.

Figure 3:
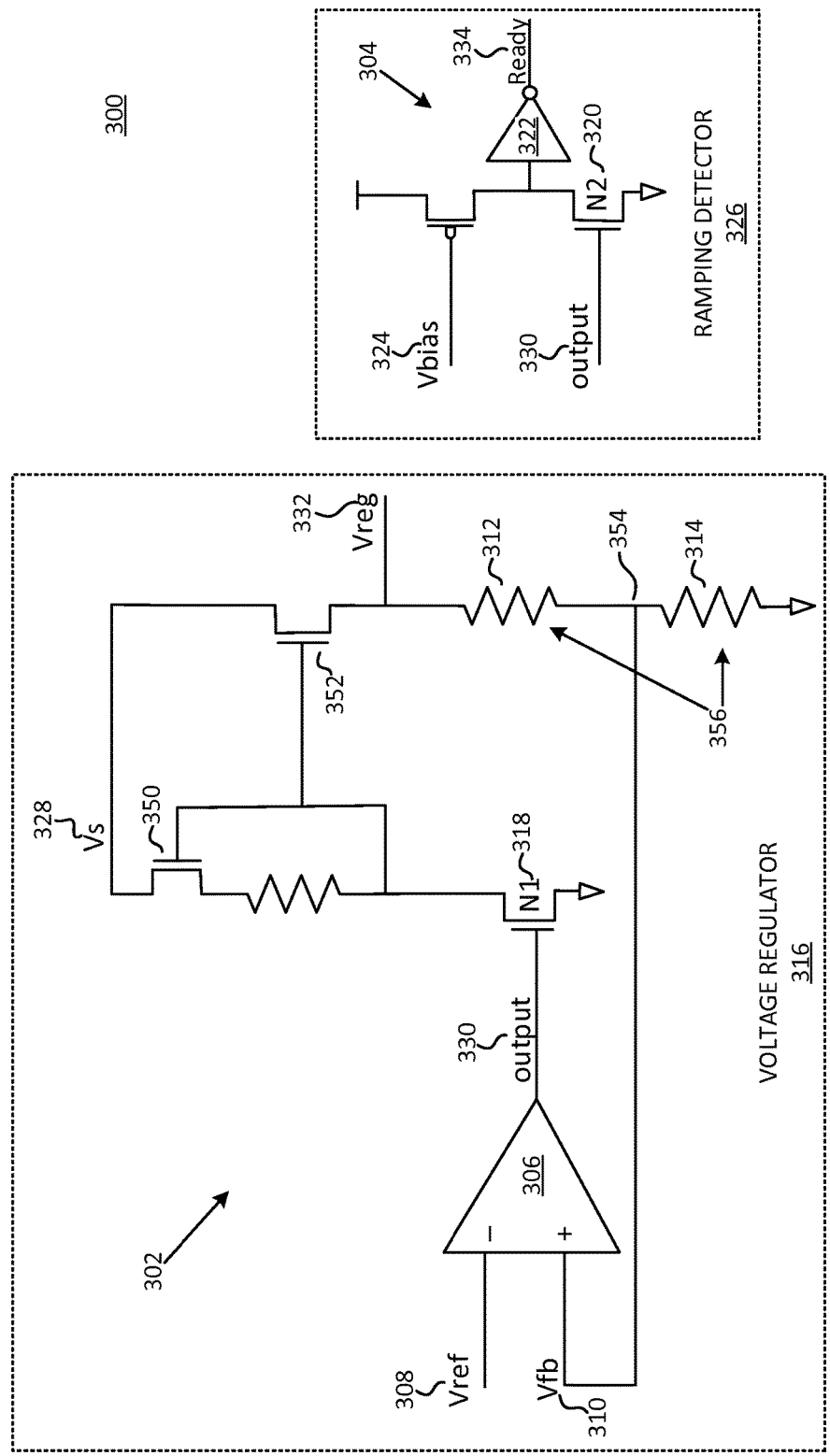
FIG. 3 illustrates an example of circuitry for a ramping detection system.

FIG. 3 illustrates an embodiment of a ramping detection system comprising circuitry to detect voltage ramping to a target voltage in steady state. In an embodiment, ramping detection system 300 includes voltage regulator 316 and ramping detector 326. Ramping detector 326 includes a ramping detector circuit 304. Voltage regulator 316 includes a voltage regulator circuit 302. Ramping detection system 300 is in accordance with ramping detection systems 100 and 200. Thus, elements of ramping detection system 300 can have similar features to elements of ramping detection systems 100 and 200.

In an embodiment, voltage regulator circuit 302 regulates supply voltage Vs 328 to regulated voltage 332, which is the target voltage level for an operation of a load circuit in steady state. It will be understood that initially supply voltage will be lower than the target voltage. Thus, regulator circuit 302 will ramp regulated voltage Vreg 332 correspondingly with increases to supply voltage 328 until supply voltage 328 is high enough to regulate down to the target voltage. The period of operation between the initial voltage output and reaching the steady state target voltage is the voltage ramping or the ramping period. Voltage ramping is substantially complete when regulated voltage 332 initially crosses or exceeds the target voltage level. Voltage reference signal Vref 308 is set to a threshold value that is proportional to the target voltage. Voltage regulator circuit 302 generates an output signal 330 to indicate whether the voltage at node 354 is below or equal to voltage reference signal 308, or greater than voltage reference signal 308. As described in more detail below, the voltage at node 354 is designed to be equal to voltage reference signal 308 when regulated voltage 332 is in steady state at the target voltage level.

In an embodiment, ramping detector circuit 304 is coupled to voltage regulator circuit 302. Ramping detector circuit 304 generates a ready signal 334 to a controller (such as controller 202 of FIG. 2A or FIG. 2B) responsive to output signal 330 turning on pull-down transistor N2 320. Transistor N2 320 is matched with transistor N1 318, and will trigger when output 330 triggers transistor N1 318 to turn on.

In an embodiment, voltage regulator circuit 302 includes a comparator 306 which identifies when regulated voltage 332 has reached the target voltage level. For example, comparator 306 compares a voltage reference signal 308 with a voltage feedback signal Vfb 310 to detect whether the regulated voltage 332 has reached the target voltage level in steady state. As supply voltage 328 ramps up, the voltage level of voltage feedback signal 310 increases in proportion to the voltage level of regulated voltage 332. Feedback signal 310 is produced at a common node 354 of voltage divider 356 coupled between the regulated voltage 332 and a low voltage rail. It will be understood that the voltage level of feedback signal 310 is equivalent to the regulated voltage 332 divided in accordance with a ratio of resistors in voltage divider 356. Voltage divider 356 comprises a first resistor 312 and a second resistor 314. Typically first resistor 312 has a greater resistance than second resistor 314. A ratio of the resistance of first resistor 312 to the second resistor 314 drives feedback signal 310 below voltage reference signal 308 until regulated voltage 332 reaches the target voltage.

In one embodiment, first resistor 312 and second resistor 314 are fixed values of resistance. In one embodiment, first resistor 312 is a variable resistor, and can be programmed to a different resistance based on a configuration of voltage regulator 316 (e.g., set to a different value based on different target output voltages for regulated voltage 332). In one embodiment, second resistor 314 is a variable resistor and can be programmed to a different resistance based on a configuration of voltage regulator 316. In one embodiment, both first resistor 312 and second resistor 314 are variable resistors.

In an embodiment, voltage feedback signal 310 exceeds voltage reference signal 308 upon substantial completion of ramping of regulated voltage 332. Substantial completion of ramping refers to completion of ramping within accepted tolerances as are known in the art. It will be understood that substantial completion of the ramping refers to reaching the target voltage level within accepted tolerance, and can be contrasted from achieving a percentage of the target voltage level. Comparator 306 compares voltage feedback signal 310 and voltage reference signal 308. When voltage feedback signal 310 exceeds voltage reference signal 308, output signal 330 transitions from low to high. It will be understood that the circuits could be configured to operate on the reverse logic, where output signal 330 transitioning from high to low would trigger an indication that the flat top has been reached. In an embodiment, voltage feedback signal 310 exceeds voltage reference signal 308 when regulated voltage 332 reaches the target voltage. Thus, comparator 306 can be said to generate an indication of when regulator voltage 332 achieves a flat top voltage. When output signal 330 transitions to a high voltage output, output signal 330 activates a first transistor N1 318. In this way, voltage regulator 316 detects when regulated voltage 332 has reached the target voltage and provides feedback to a voltage supply 328, for example, by turning off transistors 350 and 352. In an embodiment, voltage supply 328 may be supplied by a charge pump.

In an embodiment, ramping detector circuit 304 receives output signal 330 and to generate a ready signal 334 responsive to output signal 330 (e.g., responsive to a transition of the output signal). Ramping detector circuit 304 can be coupled to voltage regulator circuit 302 in a variety of ways. In one embodiment, first transistor 318 within voltage regulator circuit 302 is matched to second transistor 320 within ramping detector circuit 304. Thus, it will be understood that the behavior of first transistor 318 and second transistor 320 will be proportional no matter the operating conditions of system 300, since they are created by the same processing in the same substrate. In one embodiment, first transistor 318 and second transistor 320 can be coupled in parallel and can share a source. Common source transistors are generated by the same manufacturing process, and can be activated by different gates. In one embodiment, both the gates and the sources of transistors 318 and 320 are coupled, and the transistors have different drains to separately drive different circuits. The drain of transistor 320 controls transistors 350 and 352 to regulate the output voltage of the voltage regulator circuit. The drain of transistor 320 drives the input to inverter 322 low. First transistor 318 and/or second transistor 320 can be N-type metal-oxide-semiconductor logic (NMOS) devices or other transistor technologies known to those of skill in the art.

In an embodiment, ramping detector circuit 304 includes an inverter 322 which is held in an "ON" state by a low current bias signal Vbias 324. The bias current is small and thus minimizes power consumption. Low current bias signal 324 is a bias level that is equal to or barely above the threshold voltage (Vt) of the p-type transistor activated by Vbias. Thus, the p-type transistor will be weakly on, conducting a low current. The amount of current conducted by the p-type transistor will be overwhelmed by the current that flows through second transistor 320 when it is activated by output 330. Voltage regulator circuit 302 sends output signal 330 to ramping detector circuit 304. Output signal 330 activates second transistor 320. When converted to a comparator input offset, first transistor 318 and second transistor 320 Vt mismatch is divided by comparator 306 first-stage gain. Thus, any mismatch between the two transistors, which will be small to begin with, will be negligible. Responsive to activation of the second transistor 320, ramping detector circuit 304 generates ready signal 334. For example, activation of second transistor 320 causes the input of inverter 322 to go low and generate ready signal 334. In an example, ready signal 334 is propagated to a controller for processing, referring to an on-die or on-chip controller of the memory device. For example, the controller can infer based on the ready signal 334 that the regulated voltage 332 has reached a target voltage in steady state, the steady state target voltage being a voltage level that enables a load circuit to perform an operation. The controller may trigger the operation based on ready signal 334.

In an embodiment, voltage regulator 316 potentially can encounter periods during execution of an operation when regulated voltage 332 has reached the target voltage in steady state and then regulated voltage 332 momentarily drops below the target voltage during a fluctuation in supply voltage 328, for example. In one embodiment, voltage regulator circuit 302 and/or at ramping detector circuit 304 includes circuitry (not necessarily shown) that triggers a latch upon a first transition of output signal 330 during execution of any particular operation. Such a latch can be referred to as a sticky latch, and will hold its value after being triggered, and requires resetting prior to being able to be triggered again. In another embodiment, the controller processes ready signal 334 once per operation to prevent fluctuations in regulated voltage 332 from causing multiple iterations of ready signal 334 from being processed.

Figure 4:
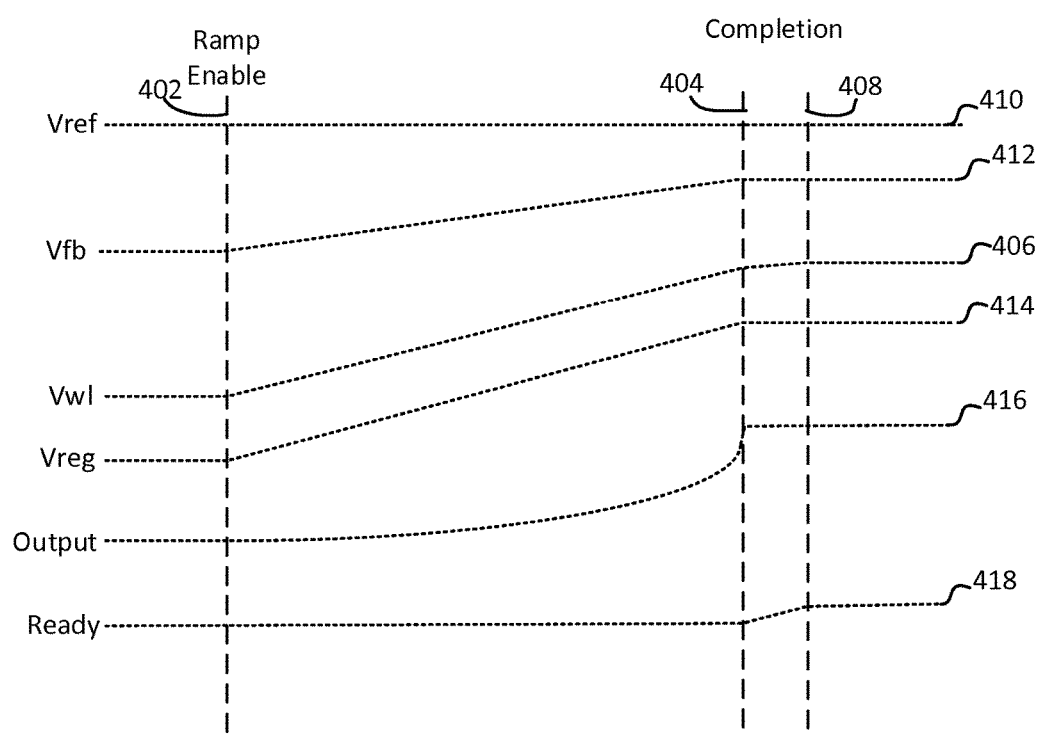
FIG. 4 is a timing diagram illustrating an example of timing of various signals for detecting voltage ramping to a target voltage level in steady state.

FIG. 4 is a timing diagram illustrating an embodiment of timing of various signals for detecting voltage ramping to a target voltage level in steady state. In an embodiment, reference voltage Vref 410 is a fixed voltage supplied to a voltage regulator, such as voltage regulator 102. Starting at time 402, feedback voltage Vfb 412 goes from low to high at time 404 as regulated voltage Vreg 414 goes from low to high in the same period. In an embodiment, regulated voltage 414 charges up a wordline as a load circuit. Thus, wordline voltage Vwl 406 goes from low to high as regulated voltage 414 goes from low to high. However, due to possible RC delays on wordline voltage 406, wordline voltage 406 might not reach the target voltage level or "flat-top" as quickly as regulated voltage 414. For example, wordline voltage 406 reaches the target voltage level or flat-top at time 408 which is later than when the regulated voltage 414 reaches flat-top at time 404. Thus, in an embodiment, a controller can schedule or build in a certain amount of delay between a flat top indication for regulated voltage 414 and an operation based on wordline voltage 406 being at the target voltage level, to account for the RC delay of wordline voltage 406. While the diagram does not indicate specific voltage levels, it will be understood that regulated voltage 414 and wordline voltage 406 charge to a greater voltage value than reference voltage 410 and feedback voltage 412. For example, feedback voltage 412 can be divided down as illustrated in FIG. 3, where the feedback voltage was dependent on a ratio of first resistor 312 to second resistor 314. Ready signal 418 will turn "ON" when regulated voltage 414 reaches the target voltage level or flat-top at time 404 and output signal 416 is activated also at time 402. In an embodiment, ready signal 418 is digital and can quickly swing up starting at about time 404 to complete the swing at about time 408.

Figure 5:
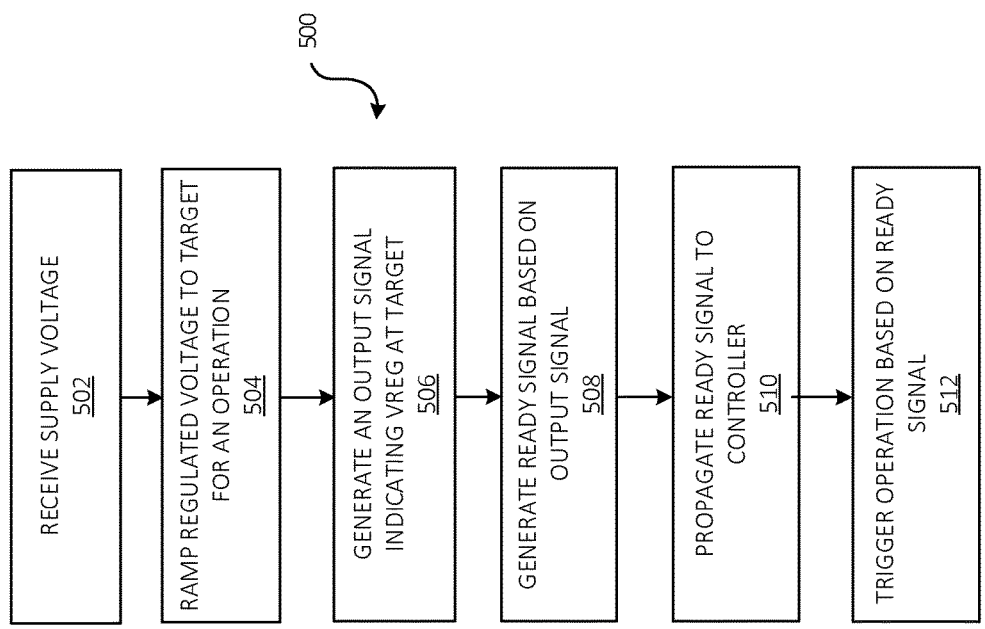
FIG. 5 is a block diagram illustrating an example process for detecting voltage ramping to a target voltage level in steady state.

FIG. 5 is a block diagram illustrating an embodiment process for detecting voltage ramping to a target voltage level in steady state. Process 500 begins at operation 502, where a voltage regulator receives a voltage supply from a charge pump. The voltage can be a high voltage of about 3.0V to about 35.0V, for example. At operation 504, the voltage regulator ramps the regulated voltage to a target voltage level of about 3.0v to about ~35.0V in steady state for an operation of a load circuit by controlling the voltage supply. These voltage ranges are merely example ranges, other voltages can be used in accordance with the various embodiments described herein and claimed subject matter is not so limited. At operation 506, the voltage regulator generates an output signal indicating that the regulated voltage has reached the steady state target voltage level. The voltage regulator generates an output signal responsive to detection of the regulated voltage reaching the target voltage level. In an embodiment, the voltage regulator detects when the regulated voltage reaches the target voltage level in steady state by a variety of methods. One such method is by comparing a feedback signal associated with the regulated voltage to a reference voltage signal set to the target voltage level for the regulated voltage. In an embodiment, the voltage regulator generates the output signal if the feedback signal exceeds the reference voltage signal. At operation 508, the ramping detector generates a ready signal responsive to detecting the output signal. In an embodiment, the output signal activates a first transistor. The first transistor is disposed in the voltage regulator and is coupled to a second transistor within the ramping detector. The first transistor and the second transistor are coupled, for example, in parallel. Thus, the output signal is propagated from the voltage regulator to the ramping detector. In an embodiment, the first transistor and the second transistor are matched. At operation 510, the ramping detector propagates the ready signal to a controller. In an embodiment, the ready signal is propagated to the controller responsive to activation of the second transistor. At operation 512, the controller triggers the operation based on the ready signal. In an embodiment, the load circuit is a wordline or a bitline in a NAND memory device.

Figure 6:
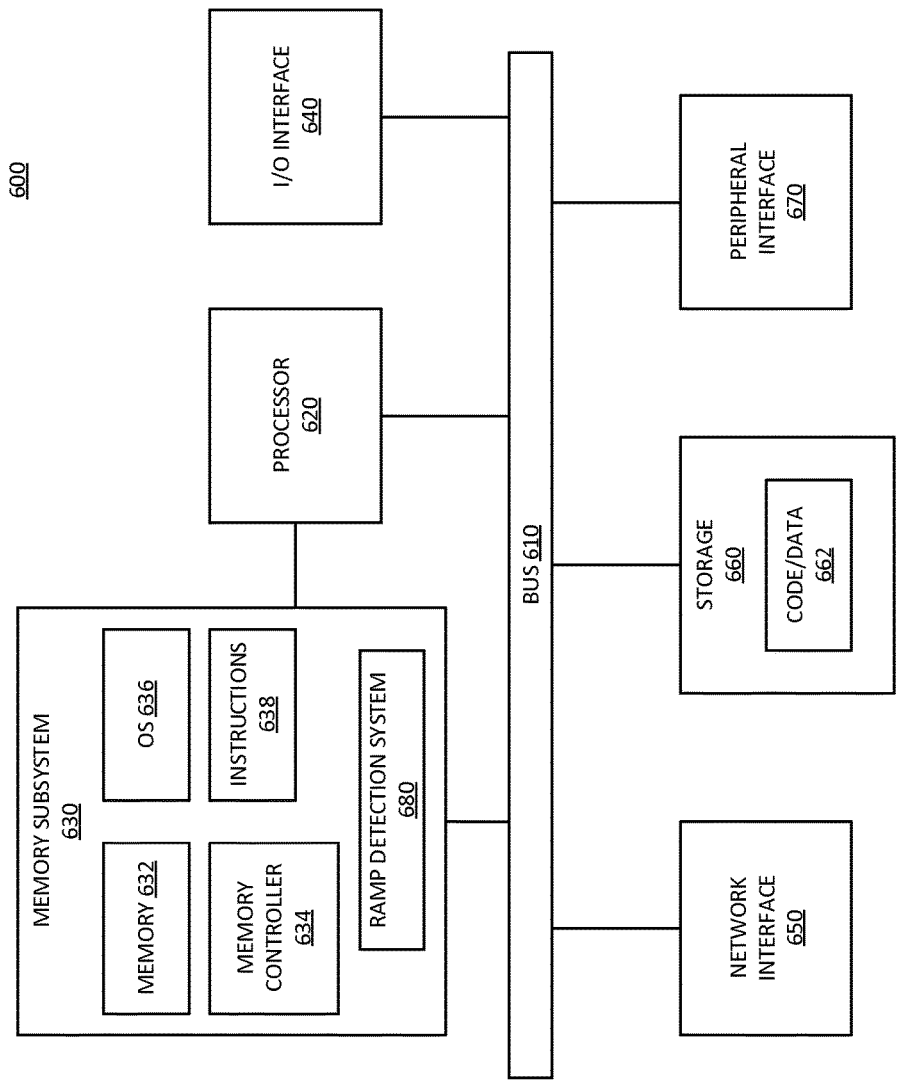
FIG. 6 is a block diagram of an embodiment of a computing system in which memory device I/O swing control can be implemented.

FIG. 6 is a block diagram of an embodiment of a computing system in which ramping detection can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620. Memory controller 634 is coupled to ramping detection system 680 detects voltage ramping completion as described hereinabove.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In an embodiment, memory subsystem 630 includes ramp detection system 680, which can be a ramp detection system in accordance with any embodiment described herein. Ramp detection system 680 detects a flat top voltage, when a regulated voltage ramps up to a target steady state voltage. In response to detecting the flat top voltage, ramp detection system 680 can generate a ready signal to indicate that the operation waiting for the ramping of the voltage can be executed. Thus, a controller on memory 632, for example (controller not shown), can schedule execution of an operation to be initiated as soon as the ready signal is received. In one embodiment, other subsystems of system 600 can include ramp detection system 680 to enable detection of completion of ramping of a regulated voltage.

Figure 7:
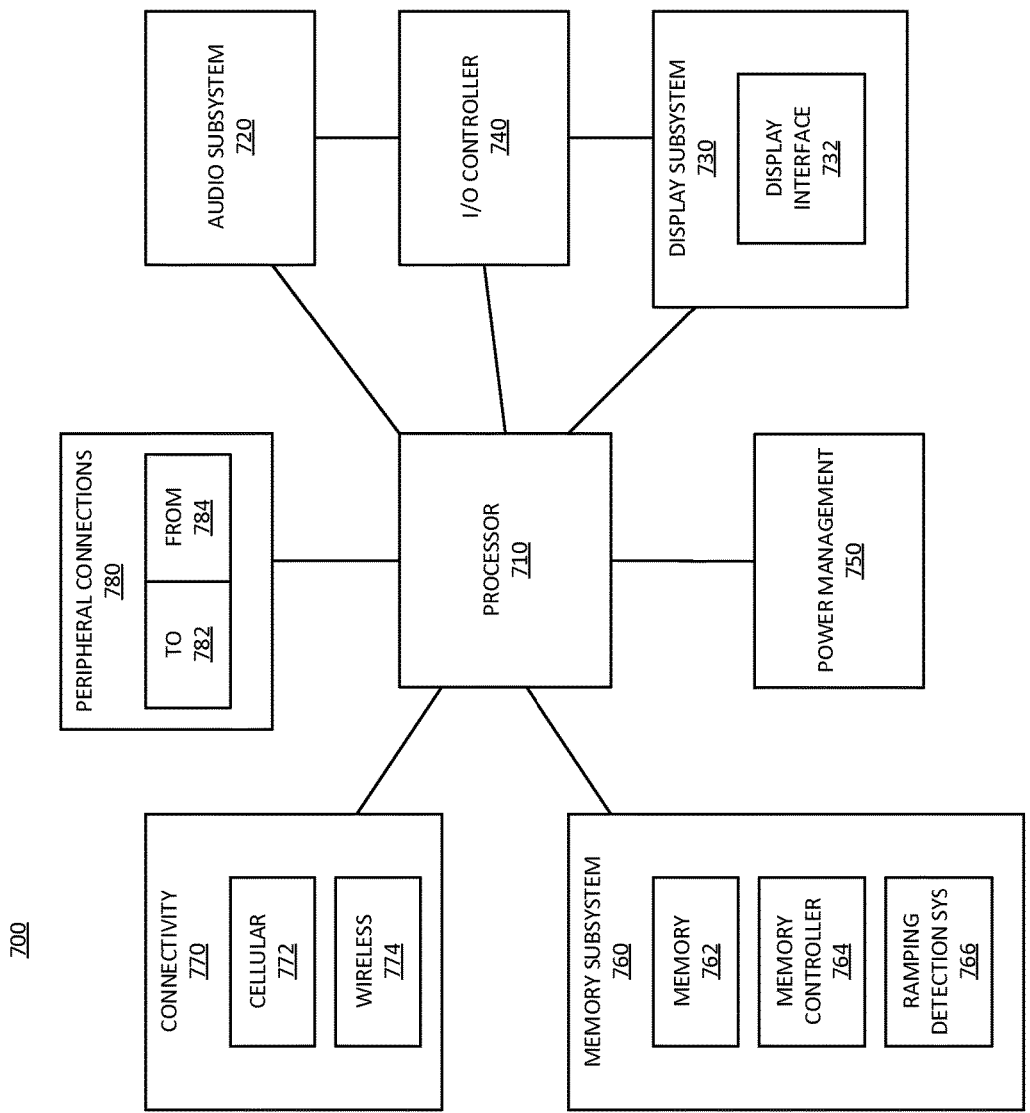
FIG. 7 is a block diagram of an embodiment of a mobile device in which memory device I/O swing control can be implemented.

FIG. 7 is a block diagram of an embodiment of a mobile device in which voltage ramping detection can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another embodiment, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762. Memory subsystem 760 includes a ramping detection system 766 detects voltage ramping completion as described in greater detail hereinabove.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In an embodiment, memory subsystem 760 includes ramp detection system 766, which can be a ramp detection system in accordance with any embodiment described herein. Ramp detection system 766 detects a flat top voltage, when a regulated voltage ramps up to a target steady state voltage. In response to detecting the flat top voltage, ramp detection system 766 can generate a ready signal to indicate that the operation waiting for the ramping of the voltage can be executed. Thus, a controller on memory 762, for example (controller not shown), can schedule execution of an operation to be initiated as soon as the ready signal is received. In one embodiment, other subsystems of system 700 can include ramp detection system 766 to enable detection of completion of ramping of a regulated voltage.

In one aspect, a method for detecting voltage ramping to a target voltage level in steady state includes: ramping a regulated voltage to a steady state target voltage for an operation of a load circuit, the steady state target voltage being a voltage level that enables the load circuit to perform the operation; generating an output signal indicating that the regulated voltage has reached the target voltage; and generating a ready signal responsive to detecting the output signal.

In one embodiment, further comprising triggering the load circuit to perform the operation based on the ready signal. In one embodiment, wherein generating the output signal further comprises comparing a feedback signal associated with the regulated voltage to a reference voltage and generating the output signal if the feedback signal exceeds the reference voltage. In one embodiment, wherein generating the ready signal further comprises activating a first transistor and a second transistor with the output signal, wherein the first transistor and the second transistor are matched transistors. In one embodiment, wherein load circuit comprises a wordline or a bitline in a NAND memory device.

In one aspect, a circuit to detect voltage ramping to a steady state includes: a voltage regulator configured to generate a regulated voltage from a supply voltage; and generate an output signal indicating that the regulated voltage has reached a steady state target voltage, the steady state target voltage being a voltage level that enables a load circuit to perform an operation; and a voltage ramping detection circuit coupled to the voltage regulator configured to generate a ready signal responsive to detecting the output signal.

In one embodiment, wherein the voltage regulator includes a comparator configured to generate the output signal when the regulated voltage has reached the target voltage. In one embodiment, wherein the comparator is configured to compare a voltage reference signal with a voltage feedback signal to detect whether the regulated voltage has reached the target voltage, wherein the voltage feedback signal is configured to increase in proportion to the regulated voltage and exceed the voltage reference signal upon completion of ramping of the regulated voltage. In one embodiment, wherein the feedback voltage comprises a signal produced at a common node of a voltage divider coupled between the regulated voltage and a low voltage rail. In one embodiment, wherein the voltage ramping detection circuit is held in an ON state by a low current bias. In one embodiment, wherein the output signal is supplied to a first transistor within the voltage regulator and a second transistor within the voltage ramping detection circuit, wherein the second transistor is matched to the first transistor. In one embodiment, wherein the voltage ramping detection circuit generates the ready signal responsive to activation of the second transistor. In one embodiment, wherein the voltage ramping detection circuit further comprises an inverter coupled to the second transistor, the inverter configured to generate the ready signal. In one embodiment, wherein the first and second transistors are N-type metal-oxide-semiconductor logic (NMOS) devices. In one embodiment, wherein the load circuit comprises a wordline or a bitline in a NAND memory device.

In one aspect, an electronic device with voltage ramping detection includes: a memory subsystem having a memory device having multiple physical rows of memory cells; and ramping detection logic coupled to the memory device, the ramping detection logic to ramp a regulated voltage to a steady state target voltage for an operation of a load circuit, the steady state target voltage being a voltage level that enables the load circuit to perform the operation; generate an output signal indicating that the regulated voltage has reached the target voltage; and generate a ready signal to a controller responsive to detecting the output signal.

In one embodiment, wherein the voltage regulator includes a comparator configured to generate the output signal when the regulated voltage has reached the target voltage. In one embodiment, wherein the comparator is configured to compare a voltage reference signal with a voltage feedback signal to detect whether the regulated voltage has reached the target voltage, wherein the voltage feedback signal is configured to increase in proportion to the regulated voltage and exceed the voltage reference signal upon completion of ramping of the regulated voltage. In one embodiment, wherein the feedback voltage comprises a signal produced at a common node of a voltage divider coupled between the regulated voltage and a low voltage rail. In one embodiment, wherein the voltage ramping detection circuit is held in an ON state by a low current bias. In one embodiment, wherein the output signal is supplied to a first transistor within the voltage regulator and a second transistor within the voltage ramping detection circuit, wherein the second transistor is matched to the first transistor. In one embodiment, wherein the voltage ramping detection circuit generates the ready signal responsive to activation of the second transistor. In one embodiment, wherein the voltage ramping detection circuit further comprises an inverter coupled to the second transistor, the inverter configured to generate the ready signal. In one embodiment, wherein the first and second transistors are N-type metal-oxide-semiconductor logic (NMOS) devices. In one embodiment, wherein the load circuit comprises a wordline or a bitline in a NAND memory device.

In one aspect, an article of manufacture comprising a computer readable storage medium having content stored thereon, which when accessed causes a computing device to perform operations for detecting voltage ramping to a target voltage level, including: ramping a regulated voltage to a steady state target voltage for an operation of a load circuit, the steady state target voltage being a voltage level that enables the load circuit to perform the operation; generating an output signal indicating that the regulated voltage has reached the target voltage; and generating a ready signal responsive to detecting the output signal.

In one embodiment, further comprising content for triggering the load circuit to perform the operation based on the ready signal. In one embodiment, wherein the content for generating the output signal further comprises content for comparing a feedback signal associated with the regulated voltage to a reference voltage and generating the output signal if the feedback signal exceeds the reference voltage. In one embodiment, wherein the content for generating the ready signal further comprises content for activating a first transistor and a second transistor with the output signal, wherein the first transistor and the second transistor are matched transistors. In one embodiment, wherein load circuit comprises a wordline or a bitline in a NAND memory device.

In one aspect, an apparatus for detecting voltage ramping to a target voltage level includes: means for ramping a regulated voltage to a steady state target voltage for an operation of a load circuit, the steady state target voltage being a voltage level that enables the load circuit to perform the operation; means for generating an output signal indicating that the regulated voltage has reached the target voltage; and means for generating a ready signal responsive to detecting the output signal.

In one embodiment, further comprising means for triggering the load circuit to perform the operation based on the ready signal. In one embodiment, wherein the means for generating the output signal further comprises means for comparing a feedback signal associated with the regulated voltage to a reference voltage and generating the output signal if the feedback signal exceeds the reference voltage. In one embodiment, wherein the means for generating the ready signal further comprises means for activating a first transistor and a second transistor with the output signal, wherein the first transistor and the second transistor are matched transistors. In one embodiment, wherein load circuit comprises a wordline or a bitline in a NAND memory device.

Flow diagrams as illustrated herein provide embodiments of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for detecting voltage ramping to a target voltage level, comprising:
    ramping a regulated voltage to a steady state target voltage for an operation of a load circuit, the steady state target voltage being a voltage level that enables the load circuit to perform the operation;
    generating an output signal indicating that the regulated voltage has reached the target voltage;
    triggering a voltage regulation circuit with the output signal to regulate the regulated voltage to the target voltage; and
    triggering a detection circuit with the output signal to generate a ready signal in response to the output signal indicating that the regulated voltage has reached the target voltage, wherein the ready signal is to cause the load circuit to perform the operation;
    wherein triggering the detection circuit to generate the ready signal further comprises activating a first transistor of the voltage regulation circuit and a second transistor of the detection circuit with the output signal, wherein the first transistor and the second transistor are matched transistors.

2. The method of claim 1, wherein the ready signal to cause the load circuit to perform the operation includes causing the load circuit to perform a write operation of a nonvolatile memory based on the ready signal.

3. The method of claim 1, wherein generating the output signal further comprises comparing a feedback signal associated with the regulated voltage to a reference voltage and generating the output signal if the feedback signal exceeds the reference voltage.

4. The method of claim 1, wherein the ready signal is to reach a voltage level to cause the load circuit to perform the operation at a time corresponding to the load circuit reaching the target voltage for performance of the operation.

5. The method of claim 1, wherein the load circuit comprises a wordline or a bitline in a NAND memory device.

6. A circuit to detect voltage ramp-up to a target voltage, comprising:
    a voltage regulator configured to:
        generate a regulated voltage from a supply voltage, the supply voltage to ramp up from below a steady state target voltage to above the target voltage, the target voltage being a voltage level to enable a load circuit to perform an operation; and
        generate an output signal in response to a ramp up of the regulated voltage to the target voltage, the output signal to trigger a voltage regulation circuit to begin regulation of the supply voltage to the target voltage; and
    a voltage ramp-up detection circuit coupled to the voltage regulator, wherein the voltage ramp-up detection circuit is configured to:
        detect the output signal, and
        responsive to detection of a level of the output signal to indicate that the regulated voltage has reached the target voltage, generate a ready signal to cause the load circuit to perform the operation;
    wherein the output signal is to be supplied to a first transistor within the voltage regulation circuit and a second transistor within the voltage ramp-up detection circuit, wherein the second transistor is matched to the first transistor.

7. The circuit of claim 6, wherein the voltage regulator includes a comparator configured to generate the output signal when the regulated voltage has reached the target voltage.

8. The circuit of claim 7, wherein the comparator is configured to compare a voltage reference signal with a voltage feedback signal to detect whether the regulated voltage has reached the target voltage, wherein the voltage feedback signal is configured to increase in proportion to the regulated voltage and exceed the voltage reference signal upon ramp up of the supply voltage to the regulated voltage.

9. The circuit of claim 8, wherein the feedback voltage comprises a signal produced at a common node of a voltage divider coupled between the regulated voltage and a low voltage rail.

10. The circuit of claim 6, wherein the voltage ramp-up detection circuit is held in an ON state by a low current bias.

11. The circuit of claim 6, wherein the voltage ramp-up detection circuit generates the ready signal responsive to activation of the second transistor.

12. The circuit of claim 6, wherein the voltage ramp-up detection circuit further comprises an inverter coupled to the second transistor, the inverter configured to generate the ready signal.

13. The circuit of claim 6, wherein the first and second transistors include N-type metal-oxide-semiconductor logic (NMOS) devices.

14. The circuit of claim 6, wherein the load circuit comprises a wordline or a bitline in a NAND memory device.

15. An electronic device comprising:
a memory subsystem including
a memory device having multiple physical rows of memory cells;
a voltage regulator coupled to the memory device to provide a write voltage to write a row of the memory cells, the voltage regulator to
generate a regulated voltage at a steady state target voltage for an operation of a load circuit from a supply voltage to be ramped up from below the target voltage to above the target voltage, the target voltage being a voltage level to enable the load circuit to perform the operation;
generate an output signal in response to a ramp up of the regulated voltage to the target voltage, the output signal to trigger a voltage regulation circuit to begin regulation of the supply voltage to the target voltage; and
a voltage ramp-up detection circuit coupled to the voltage regulator, wherein the voltage ramp-up detection circuit is configured to detect the output signal, and responsive to detection of a level of the output signal to indicate that the regulated voltage has reached the target voltage, generate a ready signal to a controller to cause the load circuit to perform the operation;
wherein the output signal is to be supplied to a first transistor of the voltage regulation circuit and a second transistor of the voltage ramp-up detection circuit, wherein the first transistor and the second transistor are matched.

16. The electronic device of claim 15, wherein the voltage regulator further comprises a comparator circuit to compare a voltage reference signal with a voltage feedback signal, wherein the voltage feedback signal is configured increase in proportion to the regulated voltage and exceed the voltage reference signal upon ramp up of the supply voltage to the regulated voltage.

* * * * *